United States Patent [19]

Kusumoto

[11] Patent Number: 5,567,967
[45] Date of Patent: Oct. 22, 1996

[54] SEMICONDUCTOR DEVICE HAVING A CRYSTALLIZED ISLAND SEMICONDUCTOR LAYER

[75] Inventor: Naoto Kusumoto, Kanagawa, Japan

[73] Assignee: Semiconductor Energy Laboratory Co., Ltd., Kanagawa-ken, Japan

[21] Appl. No.: 265,750

[22] Filed: Jun. 27, 1994

[30] Foreign Application Priority Data

Jun. 28, 1993 [JP] Japan ..................... 5-181848

[51] Int. Cl.$^6$ .......................... H01L 27/01; H01L 27/12; H01L 31/0392
[52] U.S. Cl. ..................... 257/353; 257/52; 257/349; 257/354; 257/659
[58] Field of Search .................. 257/52, 57, 59, 257/64, 66, 290, 349, 350, 352, 353, 354, 659; 359/59

[56] References Cited

U.S. PATENT DOCUMENTS 5,378,919  1/1995  Ochiai ..................... 257/204
5,414,276  5/1995  McCarthy ..................... 257/57

Primary Examiner—Ngân V. Ngô
Attorney, Agent, or Firm—Sixbey, Friedman, Leedom & Ferguson, P.C.; Gerald J. Ferguson, Jr.; Karlton C. Butts

[57] ABSTRACT

A semiconductor device comprises a transparent insulating substrate, a first insulating layer, a semiconductor layer, a second insulating layer, and an island-like semiconductor layer in order from the side of the substrate. When the laser light is irradiated from the upper side of the semiconductor device the laser light irradiated to the portions having no island-like semiconductor layer thereon is absorbed by the semiconductor layer after being transmitted through the second insulating layer and the heat generates in the semiconductor layer. Heat diffusion occurs thereafter. At the same time, the energy of laser light by laser radiation from the upper side of the semiconductor device is absorbed in the island-like semiconductor layer. The energy is accumulated as the heat in the island-like semiconductor layer and the second insulating layer to suppress the heat diffusion into the substrate.

41 Claims, 3 Drawing Sheets

SEMICONDUCTOR DEVICE HAVING A CRYSTALLIZED ISLAND SEMICONDUCTOR LAYER

BACKGROUND OF THE INVENTION

1. Field of the Invention

The present invention relates to a process for fabricating a semiconductor device, and particularly, to a technology for crystallizing thin films in forming high quality polycrystalline island-like semiconductor layers as the essential portion of a semiconductor element. The present invention also relates to a semiconductor element fabricated by the process.

2. Description of the Related Art

Polycrystalline thin film transistors comprising a polycrystalline semiconductor layer as an active element on a transparent insulating substrate can be applied widely to switching elements for large area display devices such as an active matrix typed liquid crystal display (referred to hereinafter as "AMLCD"), three dimensional structured integrated circuits or the like. Accordingly, great interest is paid on these polycrystalline thin film transistors, and extensive study is made thereon.

The single crystal semiconductor circuit for use as the driver element of an AMLCD is fabricated at present by TAB (Tape Automated Bonding) or COG (Chip on Glass) technology. Future interest is, however, to reduce the cost by integrating the driver element with the glass substrate on which a polycrystalline or single crystal semiconductor is formed directly. Polycrystalline semiconductor has a crystal structure in minimum units and its mobility is very high as compared with that of an amorphous semiconductor. However, it is almost impossible to obtain a high mobility equivalent to that of a single crystal semiconductor because of the presence of grain boundaries. Thus, polycrystalline semiconductor having a sufficiently high mobility required for a driver element had to be fabricated by subjecting an amorphous semiconductor layer to solid phase growth at a high temperature (about 1,000° C.), or to liquid phase growth by melting using a laser and the like.

The high temperature solid phase growth process requires using an expensive quartz substrate or crystallized glass substrate, because a glass substrate is inferior in heat resistance. The process is therefore economically disadvantageous.

Contrary to the solid phase growth process above, the liquid phase growth process using laser to fabricate a polycrystalline semiconductor allows to employ inexpensive glass substrates and enables fabricating high quality polycrystalline semiconductors. In particular, the crystalline semiconductors obtained by recrystallization treatment employing the lasers, for example, argon lasers, etc., in SOI (Silicon on Insulator) technology and the like, have characteristics close to those of single crystals. However, this technology is used for the fabrication of small area display devices and can not be used in the fabrication of large area display devices such as AMLCDs.

The technology using lasers such as excimer lasers is used for large area display devices. In a semiconductor device as shown in FIG. 1, polycrystallization of an amorphous semiconductor layer is performed by laser radiation. A polycrystalline semiconductor layer with a further improved quality can be obtained by heating the substrate while irradiating a laser beam thereto under optimized conditions concerning the laser energy, number of pulsed laser shots, pulse width, and the film thickness of the semiconductor layer.

The degree of crystallization obtainable from the above process is still limited. Hence, it is required to further improve the crystallinity and thereby increase the carrier mobility of the semiconductor to operate a semiconductor element more stably at a higher speed.

Referring to FIG. 1, more specifically, the energy by laser irradiation is absorbed by an island-like semiconductor layer 3, and the heat generated by the thus absorbed energy rapidly diffuses into the insulating film 2 and further the substrate 1. The energy of the laser beam, however, is not absorbed by the region necessary for isolating each of the semiconductor elements, i.e., the region on which the island-like semiconductor layer 3 is provided. Accordingly, the laser beam is directly irradiated to the insulating layer 2, and the energy is wasted without contributing to the crystallization of the island-like semiconductor layer 3. Furthermore, it has been found that this process results in an insufficient crystallization of the semiconductor layer. For example, the degree of crystallization differs from a part to another along the direction of film thickness when heat treatment is applied from one direction (e.g., from the upper side). Accordingly, this process is found that crystallization of whole semiconductor layer is inefficient and therefore a high carrier mobility cannot be obtained.

The polycrystalline semiconductor layer fabricated by using an excimer laser and the like differs from those fabricated directly by, for example, solid phase growth and low (reduced) pressure CVD, and exhibits photosensitivity. This is characteristic of the high quality polycrystalline semiconductor fabricated by excimer laser irradiation, because the polycrystalline semiconductor thus fabricated comprises very little intragranular defects and high quality and then has physical properties similar to those of single crystal semiconductors. However, when a light such as the backlight and the like of the AMLCD is irradiated to a semiconductor element, since electric conductivity increases, the off current of the thin film transistor increases and the characteristics of a switching element impairs.

SUMMARY OF THE INVENTION

To solve the above problem, an object of the present invention is to provide a semiconductor device using a polycrystalline semiconductor having high mobility and high crystalline, to obtain stable characteristics when light is irradiated. Another object of the present invention is to provide a process for fabricating the same.

Another object of the present invention is to provide a semiconductor device comprising: a semiconductor layer formed on a transparent insulating substrate or an insulating substrate and an insulating layer formed on the semiconductor layer; and a crystallized semiconductor layer formed on the insulating layer.

Another object of the present invention is to provide a semiconductor device comprising: a semiconductor layer formed on a transparent insulating substrate or an insulating substrate and an insulating layer formed on the semiconductor layer; and a crystallized semiconductor layer formed on the insulating layer, wherein the semiconductor layer includes an amorphous semiconductor.

Another object of the present invention is to provide a semiconductor device comprising: a semiconductor layer formed on a transparent insulating substrate or an insulating substrate and an insulating layer formed on the semiconductor layer; and a crystallized semiconductor layer formed on the insulating layer, wherein the semiconductor layer includes an amorphous region located under the crystallized semiconductor layer and a crystallized region in the other portion.

Another object of the present invention is to provide a semiconductor device comprising: a semiconductor layer formed on a transparent insulating substrate and an insulating layer formed on the semiconductor layer; and a crystallized semiconductor layer formed on the insulating layer, wherein the semiconductor layer includes a portion which is located under the crystallized semiconductor layer and has light-absorbing and the other portion having transparent.

Another object of the present invention is provide a method for producing a semiconductor device comprising the step of: forming a semiconductor layer having an amorphous semiconductor on a transparent insulating substrate or an insulating substrate and forming an insulating layer on the semiconductor layer; forming an island semiconductor layer on the insulating layer; and irradiating laser light into the island semiconductor layer and a region in which the island semiconductor layer is not formed.

According to the present invention, crystallization is improved by forming a semiconductor layer on a transparent insulating substrate or an insulating substrate, forming an insulating layer on the semiconductor layer, forming an island-like semiconductor layer on the insulating layer and irradiating a laser beam into such laminate. In this manner, the heat diffusion to the substrate is as suppressed as possible in the processes of heat generation, melting, and heat diffusion which results from absorption of the laser beam occurred by the irradiation of a laser beam. Thus, heat is accumulated.

Furthermore, an amorphous semiconductor layer is formed on the substrate side of the crystallized island-like semiconductor layer constituting the semiconductor device. This semiconductor layer absorbs light such as backlight incident from the substrate side, to prevent the fluctuation of the electric conductivity from occurring due to light irradiation.

The basic constitution of a semiconductor device according to the present invention is described below. Referring to FIG. 2, a semiconductor device comprising a laminate structure comprises a transparent insulating substrate 10, a first insulating layer 11 which functions as a blocking layer, a semiconductor layer 12 having an amorphous structure, a second insulating layer 13, and an island-like semiconductor layer 14 which melts and crystallizes upon irradiating a laser light.

Referring to FIG. 2, when the laser light is irradiated from the upper side of the island-like semiconductor layer 14, the laser light irradiated to the regions having no island-like semiconductor layer 14 is transmitted through the second insulating layer 13 and absorbed into the semiconductor layer 12. By the energy of the laser light absorbed into the semiconductor layer 12, heat produces and the produced heat is then diffused.

The thermal (heat) conductivity of the semiconductor layer 12 greatly differs from that of the second insulating layer 13. For instance, in case a thin film silicon and a thin film of silicon oxide are used as the semiconductor and the insulator, respectively, the ratio of silicon to silicon oxide in thermal conductivity equals to 80:1. Thus, the heat absorbed by the region 15 (corresponding to the region having no island-like semiconductor layer thereon) of the semiconductor layer 12 diffuses two dimensionally into the region 16 (corresponding to the region having the island-like semiconductor layer thereon).

At the same time, the energy of the laser light irradiated from the upper side to the island-like semiconductor layer 14 is absorbed by the island-like semiconductor layer 14, and the heat generated in the layer 14 tends to diffuse into the substrate 10. The heat diffuses at a relatively low speed because the thermal conductivity of the second insulating layer 13 is low. Further, the temperature of the semiconductor layer 12 formed under the second insulating layer 13 is high because the heat diffuses two dimensional as described above. Thus, the energy produced in the island-like semiconductor layer 14 by laser irradiation is accumulated as heat in the island-like semiconductor layer 14 and the second insulating layer 13, and the heat diffusion into the substrate is suppressed. The crystallization of the island-like semiconductor layer 14 can be performed efficiently using the laser energy by the laser radiation and the crystallinity of the entire island-like semiconductor layer 14 can be considerably improved. Therefore, a thin film transistor having a high mobility can be fabricated by using the crystallized polycrystalline semiconductor.

Furthermore, the optical band gap (the energy at the optical absorption edge) can be reduced because the region 15 on the semiconductor layer 12 shown in FIG. 2 is crystallized. The region 15 has transparent with respect to visible light. Thus, the thin film transistor according to the present invention is also applicable to switching elements of a transmission-type AMLCD device.

The region 16 in the semiconductor layer 12 is an amorphous region. The amorphous region has a relatively large band gap, and hence, it absorbs a considerable amount of visible light. Thus, it is provided as a light shield mask for the island semiconductor layer 14 to cut off the light incident from the side of the substrate 10. Accordingly, the degradation of characteristics of a thin film transistor can be as suppressed as possible by preventing fluctuation from occurring on the electric conductivity of the polycrystalline semiconductor due to the light induced by backlight irradiation and the like.

As described above, the semiconductor layer 12 has various functions. The semiconductor layer 12 has a light shield portion located under the island semiconductor layer 14 and the other portion having transparent. Further, since the semiconductor layer 12 has higher heat conductivity than an insulator such as a glass and silicon oxide film, heat generated in operation of a thin film transistor formed on the semiconductor layer 12 can be diffused uniformly. When the semiconductor layer 12 has a ground voltage electrically, that is, the semiconductor layer 12 is grounded (earthed), electrostatic shield can be performed to prevent the destroy of the thin film transistor.

The laser used in the present invention is not limited to a particular type; but preferably employed is a laser operating at a wavelength which has a high light absorption coefficient with respect to the semiconductor layer to which the laser is irradiated. A continuous wave, pulse wave or the like is also used in the present invention.

According to the present invention, a capacitor is formed by continuously constituting a source region and a drain region for the thin film transistor, a metallic interconnection, and a second insulating layer 13. However, the semiconductor layer 12 is preferably made of an intrinsic semiconductor to prevent casting unfavorable influences on the characteristics of the thin film transistor. The semiconductor layer 12 can be provided at a desired film thickness, but preferably, it is formed at a thickness of 500 Å to 1 μm, typically 100 nm to 0.5 μm in case it is used as the switching element of an AMLCD, because a semiconductor layer in a film thickness direction is not crystallized and then transparent properties is impaired.

It is preferred that a region of the semiconductor layer 12 into which laser is irradiated has a crystalline portion (80% or more) and non-crystalline portion (10% or less).

it is preferred that the region 16 located under the island semiconductor layer 14 has hydrogen of 5 atoms % or less.

About 1 to 10 atoms % of a metal element such as Mo (molybdenum) and W (tungsten) can be added into the semiconductor layer 12.

when 0.1 to 3 atoms % of P (phosphorus) is added into the semiconductor layer 12, the surface of the silicon oxide film constituting the insulating layer 11 can be phosphorus glass in the laser crystallization. The phosphorus glass layer is used as a blocking layer for preventing Na (natrium) ions from entering the semiconductor device in an example case wherein Na ions are included in a transparent substrate. A metal element such as Mo and W can be added with P.

The insulating layers 11 and 13 are preferably made of a transparent material (e.g., silicon oxide and silicon nitride) having a melting point higher than that of the material constituting the semiconductor layer, e.g. silicon.

DETAILED DESCRIPTION OF THE PREFERRED EMBODIMENTS

[Embodiment 1]

Figure 1:
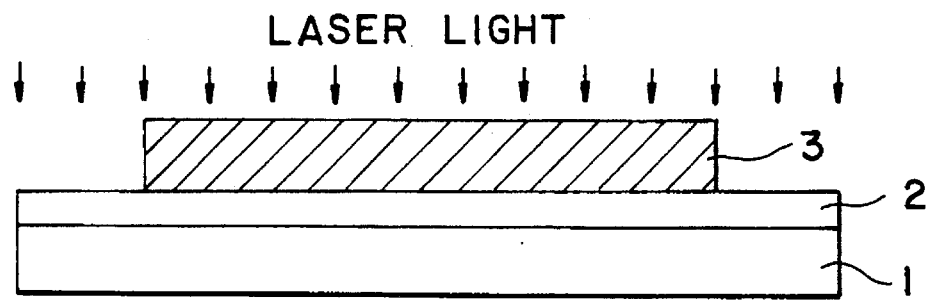
FIG. 1 is a schematic view of a conventional semiconductor device.
Figure 2:
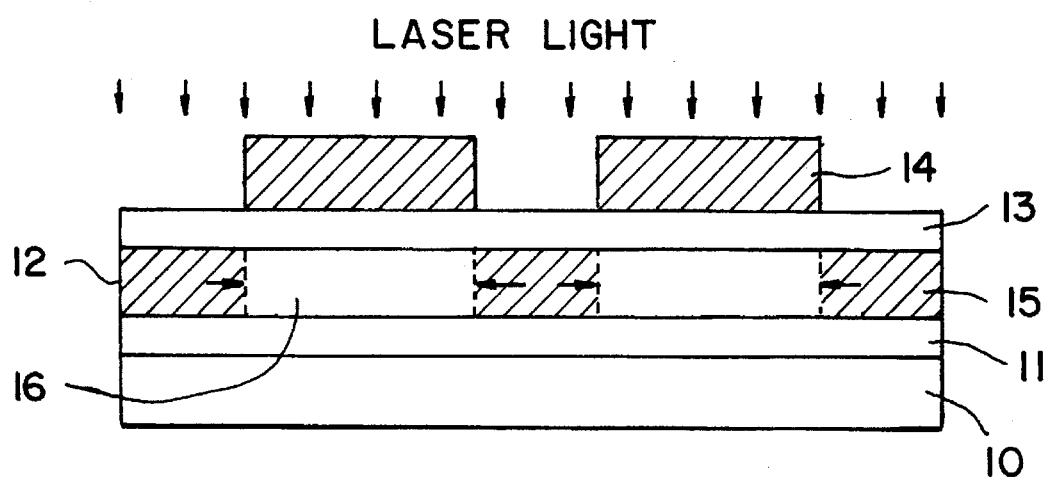
FIG. 2 is a schematic view of a semiconductor device according to an embodiment of the present invention.
Figure 3A:
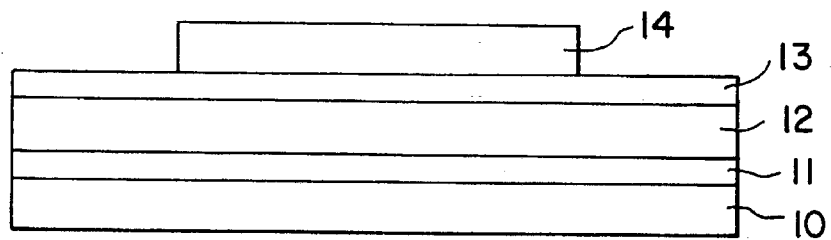
FIGS. 3A to 3D shows a process for fabricating a thin film transistor according to an embodiment of the present invention.

Referring to FIG. 3A, a meltable quarts substrate is used as a transparent insulating substrate 10. After the substrate 10 is washed, a 100 nm thick silicon oxide film as a first insulating layer 11 is deposited by RF sputtering using a synthetic quartz substrate as the target under a pressure of 0.5 Pa, an RF power of 500 W and a temperature of 200° C. Oxygen is used as the sputter gas.

A semiconductor layer 12 having a film thickness of 500 Å to 1 μm, in the embodiment, 100 nm, is deposited by RF sputtering using a non-doped single crystal silicon as the target. The film deposition is performed under a pressure of 1.0 Pa, an RF power of 1 kW, and a temperature of 300 ° C. The sputter gas is argon only, that is, hydrogen is not included in the sputter gas.

When hydrogen is present in the semiconductor layer 12 and laser light is irradiated thereto, hydrogen may be ejected from the semiconductor layer 12, thereby to destroy the insulating layer 11. To prevent this, it is preferred that a hydrogen content of an amorphous silicon constituting the semiconductor layer is 5 atoms % or less. Since an amorphous silicon (including no hydrogen) formed by argon gas sputtering has a large optical band gap and a high degree of light absorption, it is effective against the present invention. A 100 nm thick silicon oxide film is deposited as a second insulating layer 13 thereafter in the same manner as in the deposition of the first insulating layer 11.

A hydrogenated amorphous silicon is fabricated as the semiconductor layer constituting the island-like semiconductor layer 14 by RF sputtering using a non-doped single crystal silicon as the target. This film deposition is performed under a pressure of 1.0 Pa, an RF power of 1 kW, and a temperature of 300° C. The sputter gas used in this process is a 3:2 mixture of argon and hydrogen gases. The semiconductor layer thus obtained is subjected to heat treatment at 500° C. for a duration of 2 hours in nitrogen atmosphere, to remove hydrogen from the deposited semiconductor layer.

A mask is used to form an island-like semiconductor 14. A resist is formed at an island-like by photolithography, and a first island-like semiconductor layer 14 is formed by a reactive ion etching (RIE) mode of a dry etching (FIG. 3A).

Figure 3B:
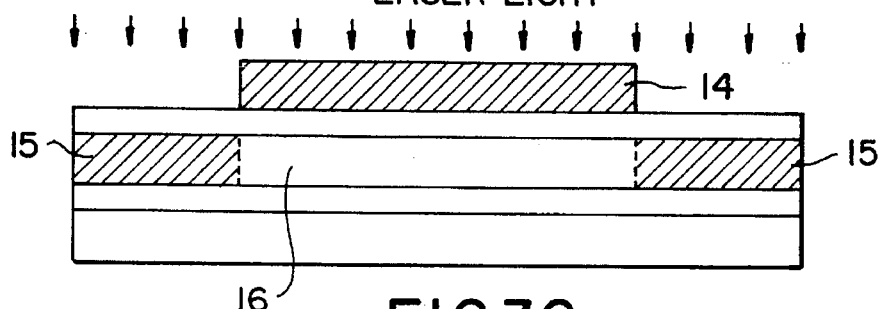

Upon completion of the above processes, the substrate having thereon the laminate is set inside the vacuum chamber, and a laser beam is irradiated thereto through a synthetic quartz window for the crystallization of the island-like semiconductor layer 14. The vacuum degree inside the vacuum chamber is maintained at $1 \times 10^{-3}$ Pa or lower, and the substrate is heated to a temperature of 450° C. by using a sheath heater. A KrF excimer laser (pulse laser) operated at a wavelength of 248 nm is used for irradiating the laser light. The laser operated in the pulse mode has an energy density of 200 to 400 mJ/cm$^2$ and is irradiated at 1 to 10 shots. Upon irradiation of the laser light to the region 15 (the portion having no semiconductor layer 14 on the upper side of the semiconductor layer 12) of the semiconductor layer 12, heat diffuses from the region 15 into the region 16 of the semiconductor layer 12 under the island-like semiconductor layer 14. The island-like semiconductor layer 14 is found to crystallize particularly favorably. The region 15 crystallizes and thereby has transparent. However, the region 16 remains amorphous and is used as a light-shield mask for the island-like semiconductor layer 14 formed as the channel region (FIG. 3B).

A silicon oxide film having 110 nm in thickness is formed as a gate insulating film by sputtering in the same manner as in forming the first and the second insulating layers 11 and 13. A hydrogenated amorphous silicon is formed as semiconductor layer for the gate electrode by sputtering in the same manner as in the formation of the island-like semiconductor layer 14. The hydrogen-containing amorphous silicon thus deposited is subjected to heat treatment at 500° C. in nitrogen atmosphere to remove hydrogen therefrom.

A mask is used thereafter to form the gate region. Etching is performed by photolithography process and RIE mode of dry etching to form the gate region (electrode) 18. Subsequently, the insulating film is etched using a mixed solution of hydrofluoric acid and ammonium fluoride to form the gate insulating film 17. In this manner, a source region and a drain region is exposed on the island-like semiconductor layer 14 in a self-aligned manner.

The substrate is placed thereafter again in a vacuum chamber, heated to 450° C., and after maintaining the chamber under high vacuum, the pressure therein is maintained at 100 Pa by using a mixed gas comprising hydrogen and 5% phosphine.

Figure 3C:
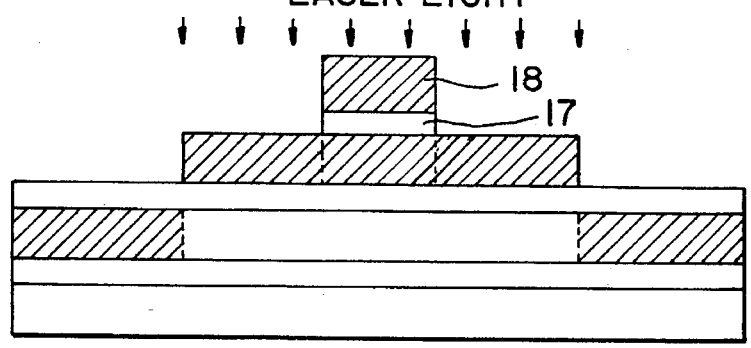

A KrF excimer laser is irradiated to lower the resistance of the source, drain, and gate regions. The laser is operated in pulsed mode at an energy density of from 300 to 350 mJ/cm$^2$, and irradiated at 50 shots. A sheet resistance obtained is 100 to 200 Ω/square (FIG. 3C).

A silicon oxide film having 500 nm in film thickness is formed as a protective film 19 in the same manner as in the process for forming the gate insulating film. A mask is used for the formation of a contact hole, and contact holes are formed by photolithography process and using a hydrofluoric acid based etching solution.

After the contact hole is formed, A 800 nm thick aluminum film is deposited by electron beam vapor deposition. An electrode 20 is formed by subjecting the aluminum film thus deposited to photolithography using a mask for electrode formation, and to wet etching using a commercially available etching solution for aluminum.

Figure 3D:
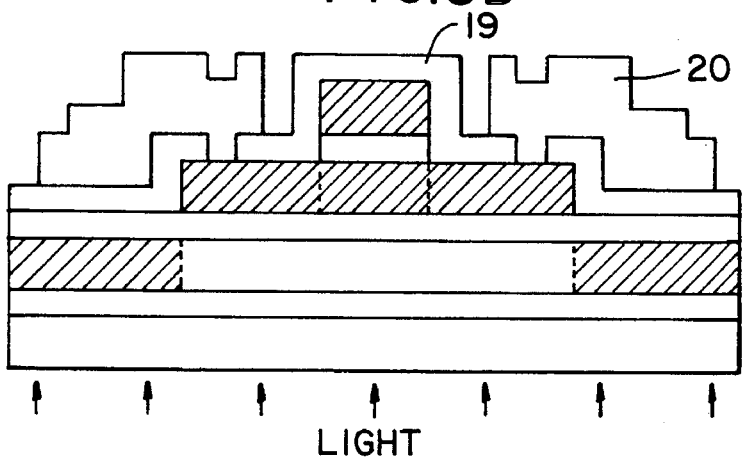

The substrate thus obtained is placed inside an annealing furnace for hydrogenation treatment to perform the heat treatment at 350° C. for a duration of 30 minutes in hydrogen atmosphere (FIG. 3D).

The mobility for the thin film transistor thus obtained is 260 cm$^2$/Vs. Furthermore, light is irradiated from the lower portion of the substrate 10 using a cold cathode ray tube (not shown in the Figure) as the backlight (see FIG. 3D). As a result, the off current of the thin film transistor is stable in the range of from $1 \times 10^{-12}$ to $5 \times 10^{-12}$ A without fluctuation under either the light-irradiated state and the non-irradiated state. In a thin film transistor using a polycrystalline semiconductor according to a conventional structure, the off current under the irradiation of light is found to be about $5 \times 10^{-10}$ A. It can be seen therefrom that the thin film transistor according to the present invention not only has a suppressed and lowered off current but also prevents the fluctuation from occurring in electric conductivity.

[Embodiment 2]

In the present embodiment, the liquid crystal electro-optical device using the thin film transistor formed in the embodiment 1 is described below.

Figure 4:
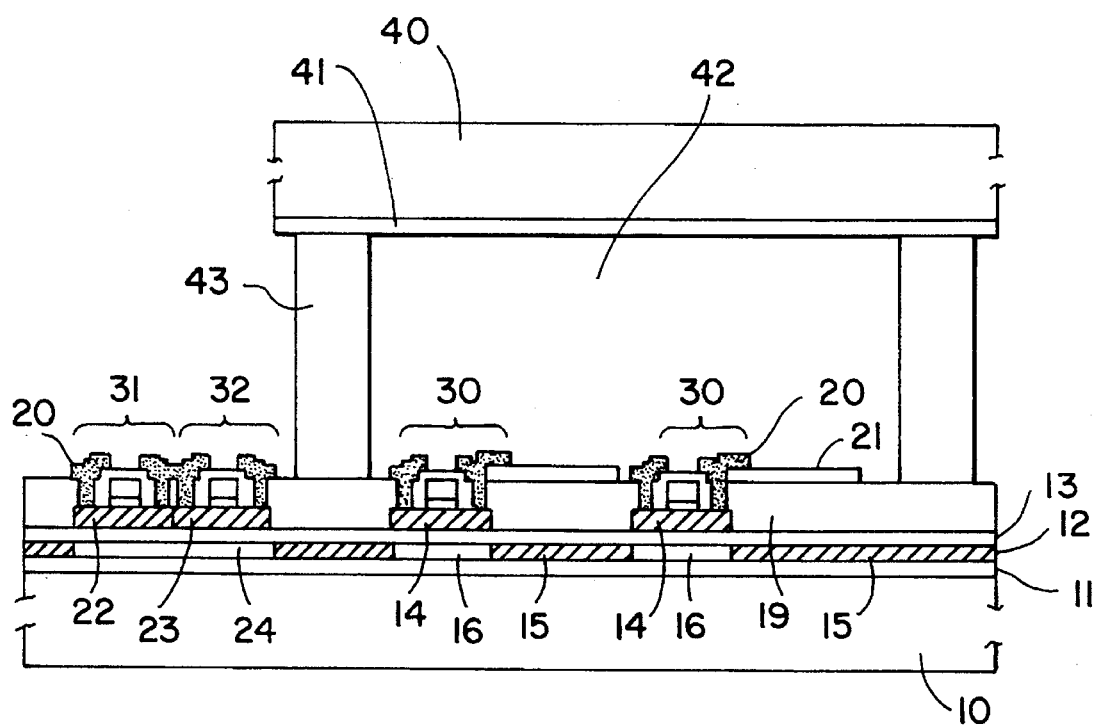
FIG. 4 is a schematic view of a liquid crystal electro-optical device using the thin film transistor according the embodiment of the present invention.
Figure 4:
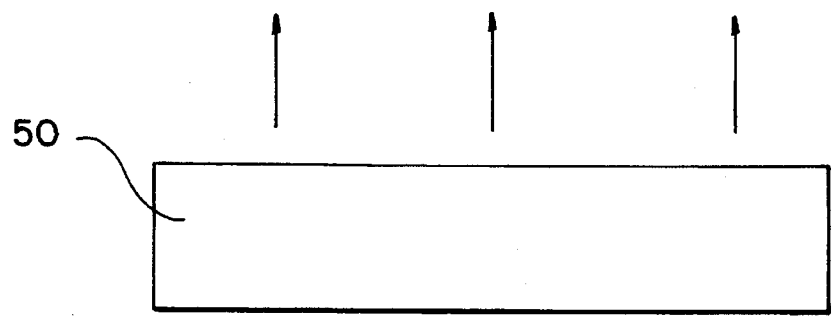

FIG. 4 is a liquid crystal electro-optical device using the thin film transistor according to the present invention. In FIG. 4, the first insulating layer 11, the semiconductor layer 12, the second insulating layer 13, a thin film transistor 30 to which an pixel electrode is connected, a P-channel thin film transistor 31 and N-channel thin film transistor 32 is formed on the transparent substrate 10.

The thin film transistor constitutes a pixel portion by a matrix arrangement. The P-channel thin film transistor 31 and N-channel thin film transistor 32 constitutes a peripheral driving circuit by a CMOS structure.

The thin film transistor has the island like semiconductor layer 14 crystallized by laser radiation process. The region 15 which is not located under the layer 14 is a region crystallized by the laser ration process to the semiconductor layer 12 as an amorphous silicon film and has transparent. Since the region 16 which is located under the layer 14 is not crystallized, the region 16 is an amorphous silicon film and functions as a light shield mask.

The pixel electrode 21 is constituted by ITO (indium tin oxide).

In the P-channel thin film transistor 31 and N-channel thin film transistor 32 which constitutes the peripheral driving circuit, island like semiconductor layers 22 and 23 are crystallized and a region 24 located under the layer 22 and 23 is not crystallized and function as a light shield mask.

A transparent substrate 40 in which an opposing electrode 41 is formed is opposed to the transparent substrate via a spacer (not shown). A nematic liquid crystal 42 is placed between the substrates 10 and 40. A surrounding portion is sealed by a seal material 43.

A rubbing processed aligning (orienting) film (not shown) is formed in inner surfaces of substrates 10 and 40 and polarizing (deflecting) plate (not shown) is formed in outer surfaces thereof.

A backlight using a cold cathode tube as a light source 50 is placed in the liquid crystal electro-optical device, to obtain a light transmission type liquid crystal display unit.

By using the thin film transistor according to the present invention, a high speed operated thin film transistor having sufficiently crystallized channel region in the peripheral driving circuit can be obtained.

In the pixel portion, an off current is not almost increased by irradiating light from the backlight. As a result, the liquid crystal display unit having a contrast ratio of 100 and sufficiently high performance as a display unit is obtained.

A projection type projector constituted by the liquid crystal electro-optical device using a metal halide lump as a light source 50 is a very superior unit.

In the semiconductor device and the process for fabricating the same according to the present invention, a laser light irradiated to the region for isolating the elements is absorbed by the amorphous semiconductor layer. The semiconductor layer is crystallized by producing the heat, and the heat diffuses two dimensionally to the directions having a high thermal conductivity. It can be seen that the thermal diffusion to the substrate from the island-like semiconductor layer is suppressed in this manner. Thus, when a pulse laser is irradiated at an energy density equivalent to that utilized in the crystallization of a conventional structure, the crystallized semiconductor layer is found to have a considerably improved crystallinity as compared to that of a conventional structure. Thus, increase of on current of the thin film transistor according to the present invention suppresses and a mobility maintains stably at a constant value.

Furthermore, the light absorption effect functions sufficiently in the predetermined region of the semiconductor layer provided under the island-like semiconductor layer. Accordingly, substantially no increase in off current due to the irradiation of light from the substrate side is observed. The region other than the predetermined regions in the semiconductor layer has transparent, and hence, the thin film transistor is found to be useful as a switching element of AMLCD devices of transparent type.

Further, by using the semiconductor layer having higher heat conductivity, heat generated in a thin film transistor can be diffused uniformly. By grounding the semiconductor layer, electrostatic shield can be performed. The peripheral driving circuit can be operated at high speed using the thin film transistor according to the present invention. Therefore, a very superior liquid crystal electro-optical device can be provided by the present invention.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
   an insulating substrate;
   a semiconductor layer formed on the insulating substrate, the semiconductor layer comprising amorphous silicon having a light-shield layer;
   an insulating layer formed on the semiconductor layer; and
   a crystallized island semiconductor layer formed on the insulating layer, the crystallized island semiconductor layer comprising silicon having a source and a drain.

2. The device of claim 1, wherein the insulating substrate includes a transparent insulating substrate.

3. The device of claim 1, wherein the semiconductor layer comprises an amorphous semiconductor.

4. The device of claim 3, wherein the amorphous semiconductor includes hydrogen of 5 atoms % or less.

5. The device of claim 3, wherein the semiconductor layer further comprises a crystallized semiconductor layer.

6. The device of claim 3, wherein the insulating substrate includes a transparent insulating substrate.

7. The device of claim 1, wherein the semiconductor layer comprises a first region located under the crystallized island semiconductor layer and a second region other than the first region, and the first region comprises an amorphous region and the second region comprises a crystallized region.

8. The device of claim 7, wherein the amorphous region includes hydrogen of 5 atoms % or less.

9. The device of claim 7, wherein the crystallized region is crystallized 80% or more.

10. The device of claim 7, wherein the semiconductor layer includes a substantially non-crystallized region which is crystallized 10% or less 11. The device of claim 7, wherein the insulating substrate includes a transparent insulating substrate.

12. A semiconductor device comprising:

an insulating substrate;

a semiconductor layer formed on the insulating substrate;

an insulating layer formed on the semiconductor layer; and a crystallized island semiconductor layer formed on the insulating layer, wherein the semiconductor layer comprises a first region located under the crystallized island semiconductor layer and a second region other than the first region, and the first region comprises an amorphous region and the second region comprises a crystallized region.

13. The device of claim 1, wherein the semiconductor layer comprises a first region located under the crystallized island semiconductor layer and a second region other than the first region, the first region has light-absorbing, and the second region has transparent.

14. The device of claim 1, wherein the semiconductor layer comprises an intrinsic semiconductor.

15. The device of claim 3, wherein the semiconductor layer comprises an intrinsic semiconductor.

16. The device of claim 7, wherein the semiconductor layer comprises an intrinsic semiconductor.

17. The device of claim 13, wherein the semiconductor layer comprises an intrinsic semiconductor.

18. The device of claim 1, wherein the semiconductor layer has 500 Å to 1 μm in thickness.

19. The device of claim 3, wherein the semiconductor layer has 500 Å to 1 μm in thickness.

20. The device of claim 7, wherein the semiconductor layer has 500 Å to 1 μm in thickness.

21. The device of claim 13, wherein the semiconductor layer has 500 Å to 1 μm in thickness.

22. The device of claim 1, wherein the insulating layer comprises a material having a melting point higher than that of the material constituting the semiconductor layer.

23. The device of claim 3, wherein the insulating layer comprises a material having a melting point higher than that of the material constituting the semiconductor layer.

24. The device of claim 7, wherein the insulating layer comprises a material having a melting point higher than that of the material constituting the semiconductor layer.

25. The device of claim 13, wherein the insulating layer comprises a material having a melting point higher than that of the material constituting the semiconductor layer.

26. The device of claim 1, wherein the semiconductor layer includes one of molybdenum atoms and tungsten atoms to be added at 0.1 to 10 atoms %.

27. The device of claim 3, wherein the semiconductor layer includes one of molybdenum atoms and tungsten atoms to be added at 0.1 to 10 atoms %.

28. The device of claim 7, wherein the semiconductor layer includes one of molybdenum atoms and tungsten atoms to be added at 0.1 to 10 atoms %.

29. The device of claim 13, wherein the semiconductor layer includes one of molybdenum atoms and tungsten atoms to be added at 0.1 to 10 atoms %.

30. A semiconductor device comprising:

an insulating substrate;

a semiconductor layer formed on the insulating substrate;

an insulating layer formed on the semiconductor layer; and a crystallized island semiconductor layer formed on the insulating layer, wherein the semiconductor layer comprises a first region located under the crystallized island semiconductor layer and a second region other than the first region, and the first region has light-absorbing, and the second region has transparent.

31. A semiconductor device comprising:

a transparent substrate;

an active semiconductor layer comprising silicon formed over said transparent substrate; and a light-blocking layer adjacent to said active semiconductor layer between said active semiconductor layer and said transparent substrate, wherein the light-blocking layer comprises amorphous silicon.

32. The device of claim 31 wherein the transparent substrate comprises a glass substrate.

33. The device of claim 31 wherein the active semiconductor layer comprises crystalline silicon.

34. The device of claim 1 further comprising a gate electrode formed on the crystallized island semiconductor layer.

35. The device of claim 12 further comprising a gate electrode formed on the crystallized island semiconductor layer.

36. The device of claim 30 further comprising a gate electrode formed on the crystallized island semiconductor layer.

37. The device of claim 31 further comprising a gate electrode formed on the active semiconductor layer.

38. The device of claim 1 wherein the crystallized region has higher crystallinity than that of the amorphous region.

39. The device of claim 12 wherein the crystallized region has higher crystallinity than that of the amorphous region.

40. The device of claim 30 wherein the crystallized region has higher crystallinity than that of the amorphous region.

41. The device of claim 30 wherein the first region has nontransparent.

* * * * *